(12) United States Patent
Sasaki et al.

(10) Patent No.: US 8,264,841 B2
(45) Date of Patent: Sep. 11, 2012

(54) HEAT SINK AND LASER DIODE

(75) Inventors: Kenji Sasaki, Kanagawa (JP); Hidekazu Kawanishi, Kanagawa (JP); Yuichi Hamaguchi, Tokyo (JP)

(73) Assignee: Sony Corporation, Tokyo (JP)

( * ) Notice: Subject to any disclaimer, the term of this patent is extended or adjusted under 35 U.S.C. 154(b) by 158 days.

(21) Appl. No.: 12/128,142

(22) Filed: May 28, 2008

(65) Prior Publication Data

US 2008/0298018 A1     Dec. 4, 2008

(30) Foreign Application Priority Data

May 31, 2007     (JP) ................................ 2007-144640

(51) Int. Cl.
*H05K 7/20* (2006.01)
*H05K 1/00* (2006.01)
*H05K 1/03* (2006.01)
*H05K 1/02* (2006.01)
*H05K 1/16* (2006.01)
*F28D 15/00* (2006.01)

(52) U.S. Cl. ........ 361/699; 361/704; 361/705; 361/714; 361/715; 174/252; 174/253; 174/256; 174/259; 174/260; 165/104.33

(58) Field of Classification Search .......... 361/699–706, 361/679.52, 679.53, 679.54, 689, 715–719; 174/15.2, 16.3, 252; 257/712–722; 165/80.2, 165/80.3, 80.4, 80.5, 104.33, 185

See application file for complete search history.

(56) References Cited

U.S. PATENT DOCUMENTS

| 6,014,312 | A | * | 1/2000 | Schulz-Harder et al. | ...... 361/699 |
| 2006/0002088 | A1 | * | 1/2006 | Bezama et al. | ............... 361/702 |
| 2006/0045153 | A1 | | 3/2006 | Carter et al. | |
| 2010/0065724 | A1 | * | 3/2010 | Hughes et al. | ................ 250/216 |

FOREIGN PATENT DOCUMENTS

| JP | 08-271175 | | 10/1996 |
| JP | 2005-223319 | | 8/2005 |
| JP | 2006-019595 | | 1/2006 |
| JP | 2006-294943 | | 10/2006 |
| JP | 2006294943 | A * | 10/2006 |
| JP | 2006-352019 | | 12/2006 |
| WO | 2005/081371 | | 9/2005 |

OTHER PUBLICATIONS

EP Communication dated Jan. 13, 2009.
Japanese Office Action issued on Nov. 30, 2011 in connection with counterpart JP Application No. 2007-144640.

* cited by examiner

*Primary Examiner* — Jayprakash N Gandhi
*Assistant Examiner* — Jerry Wu
(74) *Attorney, Agent, or Firm* — SNR Denton US LLP

(57) ABSTRACT

The present invention is directed to improve reliability by preventing deterioration in the structure of an inner wall of a water channel caused by galvanic corrosion. A heat sink in which a water channel of a cooling fluid is formed by stacking and bonding a plurality of thin plates, in which a surface in the water channel is made of the same metal material except for at least an end of a bonded part of the thin plates.

2 Claims, 9 Drawing Sheets

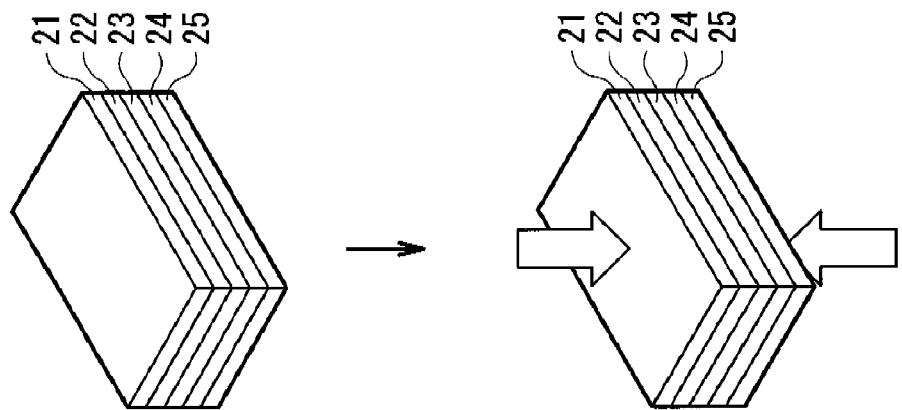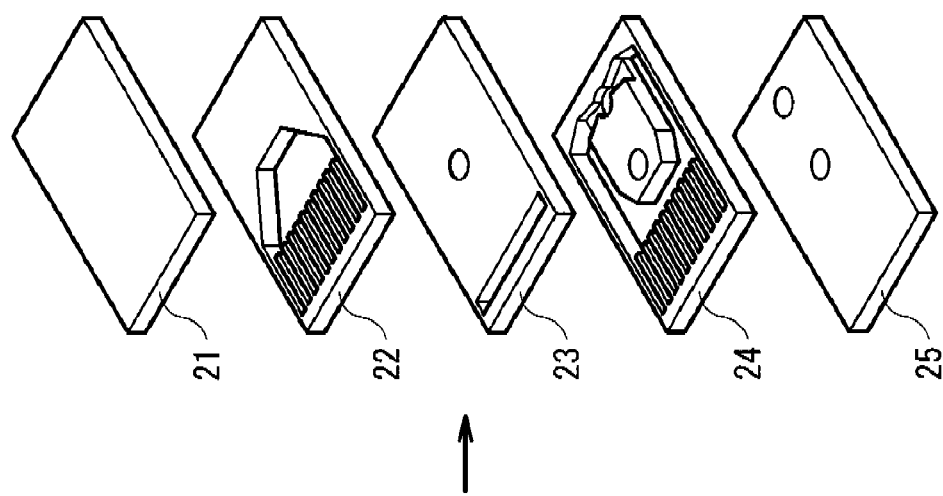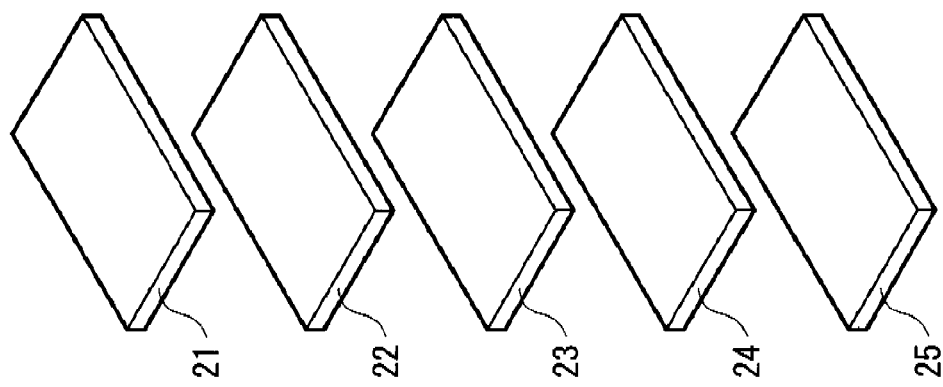

HEAT SINK AND LASER DIODE

CROSS REFERENCE TO RELATED APPLICATIONS

The present invention contains subject matter related to Japanese Patent Application JP 2007-144640 filed in the Japanese Patent Office on May 31, 2007, the entire contents of which being incorporated herein by reference.

BACKGROUND OF THE INVENTION

1. Field of the Invention

The present invention relates to a heat sink in which a channel (water channel) of a cooling fluid is formed by stacking and bonding a plurality of thin plates and to a laser diode obtained by mounting a semiconductor laser device in such a heat sink.

2. Description of the Related Art

In a laser diode of a few W to tens W class, a water cooling system is often employed to realize a higher output and higher reliability. As a heat sink structure for realizing high heat exhaust efficiency, a heat sink of a micro-channel type is well known (refer to, for example, Japanese Unexamined Patent Application Publication No. 2006-294943).

FIG. 8 shows an example of a sectional structure of a laser diode of the related art.

The laser diode is constructed by mounting a semiconductor laser chip 102 on a heat sink 101 having a fine channel structure of a micro-channel type. The heat sink 101 has a structure obtained by stacking and bonding a plurality of thin plates. In the heat sink 101, a water channel 103 (a supply water channel 103A, an intermediate water channel 103B, and an exhaust water channel 103C) through which a cooling fluid passes is formed. In the example of FIG. 8, five thin plates of a first layer 121 as a top layer to a fifth layer 125 are stacked. The first layer 121 is a laser chip mounting plate on which the semiconductor laser chip 102 is mounted. In the second and fourth layers 122 and 124, a radiator fin is formed. In the second to fifth layers 122 to 125, a hole for forming the water channel 103 is formed. The layers are bonded with an insert metal (bonding metal) 105.

A concrete manufacturing procedure of the heat sink 101 having such a structure includes the following steps.

(1) manufacture of base sheets of the layers
(2) etching of sheet materials (formation of a water channel structure)
(3) plating of the sheet materials with an inert metal (bonding metal)
(4) bonding of the sheet materials
(5) heating and pressure-bonding of the sheet materials As the material of the base sheet, generally, copper (Cu) having high heat conductivity and which is processed easily is used. As the insert metal 105, for example, gold (Au) or silver (Ag) is used. As a bonding method, liquid-phase diffusion bonding, soldering, or the like is used.

SUMMARY OF THE INVENTION

In the above-described manufacture procedure, to prevent a fine structure part from being buried by the insert metal 105 which is melt at the time of performing liquid-phase diffusion bonding or the like, the second and fourth layers 122 and 124 in which the pattern of the radiator fin is formed are not plated with the insert metal 105 but the first, third, and fifth layers 121, 123, and 125 are plated with the insert metal 105 as shown in FIG. 9. When bonding is performed after alternately plating the layers, as shown in FIG. 8, different metals appear in the inner wall of the water channel 103. Specifically, a part 201 in which the metal (copper or the like) of the base material and a part 202 in which the insert metal 105 (gold, silver, or the like) is exposed mixedly exist in the water channel 103. Due to such a structure, in the past, there is an issue such that galvanic corrosion occurs with use time. The galvanic corrosion denotes a phenomenon such that when dissimilar metals come into contact in the cooling fluid, ions move, and the metal having a lower ionization tendency is thinned (etched). When a potential difference occurs between dissimilar metals in the heat sink via the cooling fluid and water is passed for a long period of about thousands of hours, a noble metal side (for example, gold or silver) in the heat sink is thinned and a corrosion product is deposited and adhered onto a base metal side (for example, copper). Due to the phenomenon, destruction of the structure in the water channel (decrease in the cooling capability in a few thousands of hours of passing of water) and continuity with the heat sink outer wall (water leakage in a few thousands of hours of passing of water) occurs. It largely deteriorates the reliability of the heat sink.

It is desirable to provide a heat sink and a laser diode realizing improved reliability by preventing deterioration in the structure of an inner wall of a water channel due to galvanic corrosion.

According to an embodiment of the present invention, there is provided a heat sink in which a water channel of a cooling fluid is formed by stacking and bonding a plurality of thin plates. A surface in the water channel is made of the same metal material except for at least an end of a bonded part of the thin plates.

According to an embodiment of the invention, there is provided a laser diode including a heat sink in which a water channel of a cooling fluid is formed by stacking and bonding a plurality of thin plates, and a semiconductor laser device mounted on the heat sink. The surface in the water channel in the heat sink is made of the same metal except for at least an end of a bonded part of the thin plates.

In the heat sink or the laser diode of the embodiment of the present invention, in the water channel, the surfaces made of the same metal material including the end of the bonded part are exposed, or the surfaces made of the same metal material excluding an end of the bonded part are exposed. With the configuration, the surfaces in the water channel are made of substantially the same metal material, and no dissimilar metals exist in the water channel. Consequently, even when dissimilar metals exist, the amount of the dissimilar metals is very small in the surface area of in the water channel. Thus, galvanic corrosion is minimized, and reliability improves.

In the heat sink and the laser diode of the embodiment of the present invention, the surfaces in the water channel are made of the same metal material except for at least an end of a bonded part of the thin plates. Consequently, dissimilar metals do not exist or hardly exist in the surface area in the water channel. As a result, deterioration in the structure of the inner wall of the water channel caused by galvanic corrosion is prevented, and reliability may be improved.

Other and further objects, features and advantages of the invention will appear more fully from the following description.

BRIEF DESCRIPTION OF THE DRAWINGS

FIGS. 3A to 3D are manufacture process drawings showing an example of a method of manufacturing a heat sink in the first embodiment of the invention.

DETAILED DESCRIPTION OF THE PREFERRED EMBODIMENTS

Embodiments of the present invention will be described in detail hereinbelow with reference to the drawings.

First Embodiment

Figure 1:
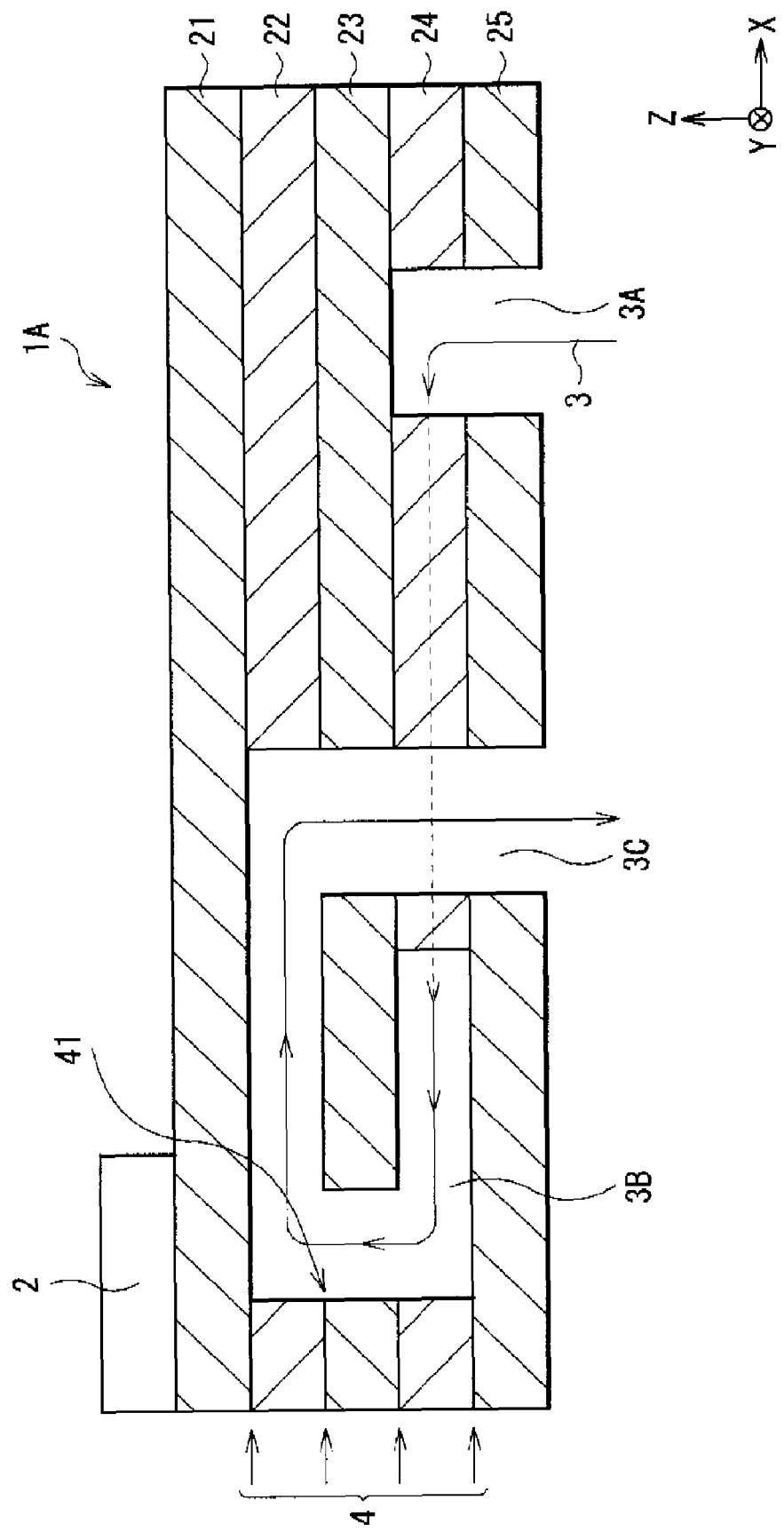
FIG. 1 is a cross section showing an example of a laser diode as a first embodiment of the present invention.
Figure 2:
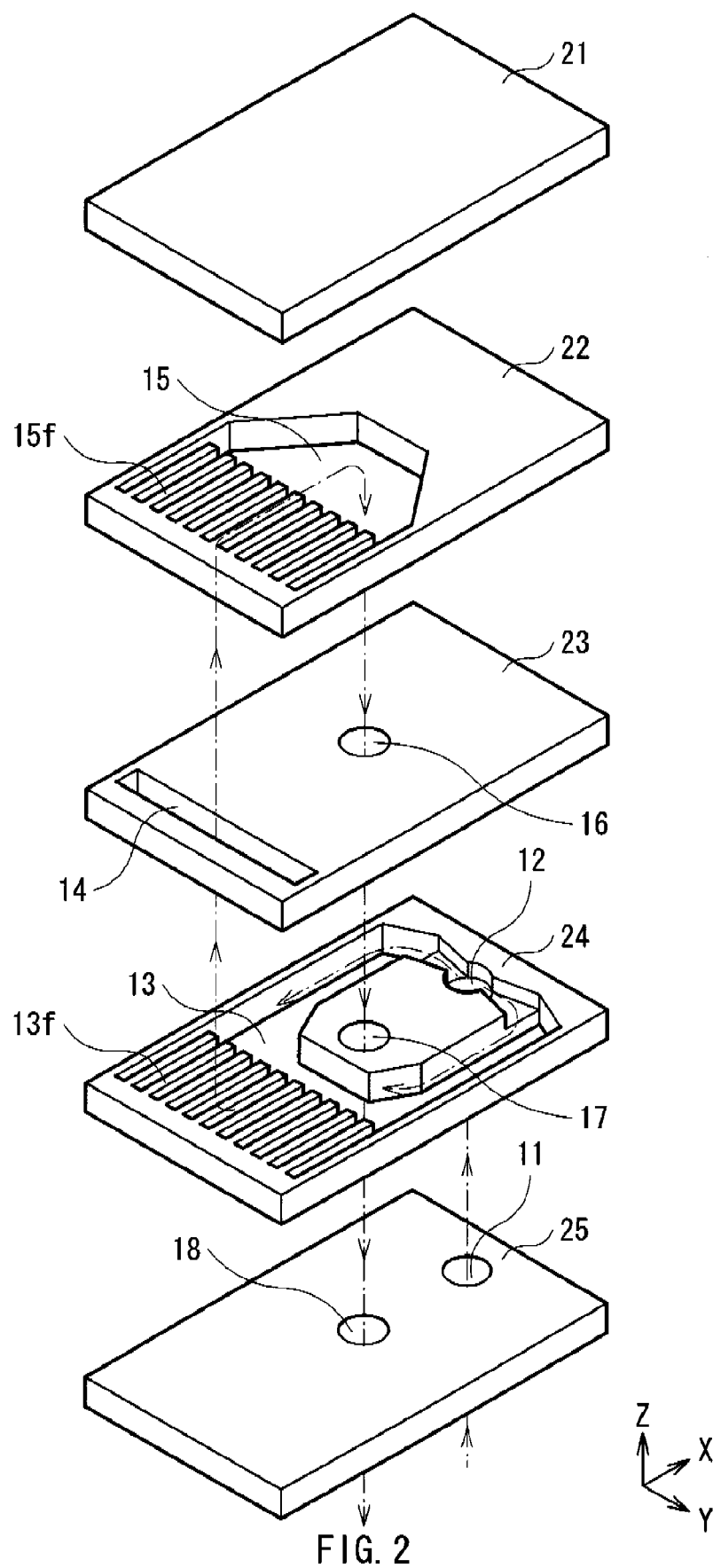
FIG. 2 is an exploded perspective view showing an example of a heat sink in the first embodiment of the invention.

FIG. 1 shows a configuration example of a laser diode as a first embodiment of the present invention. FIG. 2 is an exploded view showing a concrete example of the internal structure of a heat sink 1A applied to the laser diode.

The laser diode is constructed by mounting a semiconductor laser device 2 on the heat sink 1A having a fine channel structure of a micro-channel type. The heat sink 1A has a structure obtained by stacking and bonding a plurality of thin plates. In the heat sink 1A, a water channel 3 (a supply water channel 3A, an intermediate water channel 3B, and an exhaust water channel 3C) through which a cooling fluid passes is formed. In the embodiment, five thin plates of a first layer 21 as a top layer to a fifth layer 25 are stacked.

All of the layers 21 to 25 in the heat sink 1A are formed by thin plates made of a single metal material (such as copper, silver, or gold). The layers 21 to 25 as thin plates (base materials) are directly stacked and bonded without using an insert metal. As a result, in the surface (inner wall) in the water channel 3, all of the surfaces of the thin plates of the layers 21 to 25 including an end 41 of a bonding part 4 (an end on the water channel 3 side of the layers) are exposed.

The first layer 21 is a laser chip mounting plate on which the semiconductor laser device 2 is mounted. The second layer 22 is a plate in which a radiator fin is formed. As shown in FIG. 2, the second layer 22 has an intermediate water channel formation part 15 and radiator fins 15f. The intermediate water channel formation part 15 is formed so as to penetrate the second layer 22. A plurality of radiator fins 15f are disposed in parallel in a position corresponding to a lower part of the mounting position of the semiconductor laser device 2. A cooling water passes through the spaces between the radiator fins 15f.

The fourth layer 24 is similarly a plate in which a radiator fin is formed. As shown in FIG. 2, the fourth layer 24 has an intermediate water channel formation part 13 and radiator fins 13f. The fourth layer 24 also has a supply water channel formation hole 12 and an exhaust water channel formation hole 17. The supply water channel formation hole 12 and the exhaust water channel formation hole 17 are formed so as to penetrate the fourth layer 24.

The third layer 23 has an intermediate water channel formation part 14 and an exhaust water channel formation hole 16. The intermediate water channel formation part 14 and the exhaust water channel formation hole 16 are formed so as to penetrate the third layer 23. The intermediate water channel formation part 14 is formed in a rectangular shape and is positioned between the radiator fins 15f in the second layer 22 and the radiator fins 13f in the fourth layer 24.

The fifth layer 25 has a supply water channel formation hole 11 and an exhaust water channel formation hole 18. The supply water channel formation hole 11 and the exhaust water channel formation hole 18 are formed so as to penetrate the fifth layer 25.

The supply water channel formation hole 11 in the fifth layer 25 and the supply water channel formation hole 12 in the fourth layer 24 are provided in corresponding positions in the vertical direction, thereby forming the supply water channel 3A through which the cooling fluid passes from the lower layer side to the upper layer side. By the intermediate water channel formation part 13 and the radiator fins 13f in the fourth layer 24, the intermediate water channel formation part 14 in the third layer 23, and the radiator fins 15f and the intermediate water channel formation part 15 in the second layer 22 in order from the cooling fluid passage side, the intermediate water channel 3B through which the cooling fluid passed through the supply water channel 3A is formed. The exhaust water channel formation hole 16 in the third layer 23, the exhaust water channel formation hole 17 in the fourth layer 24, and the exhaust water channel formation hole 18 in the fifth layer 25 are provided in corresponding positions in the vertical direction. As a whole, the exhaust water channel 3C through which the cooling fluid passed through the intermediate water path 3B from an upper layer side to a lower layer side is formed.

An operation example of the laser diode will now be described.

In the laser diode, the supply water channel 3A and the exhaust water channel 3C of the heat sink 1A are connected to a not-shown circulation system called a chiller for supplying/discharging the cooling water. In the heat sink 1A, when the cooling water is supplied to the supply water channel 3A, the cooling water flows from the supply water channel 3A to the intermediate water channel 3B as described above. After that, the cooling water is discharged from the exhaust water channel 3C. The semiconductor laser device 2 converts an electric signal received from a not-shown driver element to a light signal and outputs the light signal. Heat generated when the semiconductor laser device 2 is driven is transmitted from the laser chip mounting plate (the first layer 21) into the heat sink 1A. Since the heat sink 1A has therein the radiator fins 13f and 15f in positions corresponding to the position on which the semiconductor laser device 2 is mounted, when the cooling water flows in the water channel 3, the heat received from the semiconductor laser device 2 is cooled down. In such a manner, the semiconductor laser device 2 is cooled.

A method of manufacturing the heat sink 1A in the embodiment will now be described with reference to FIGS. 3A to 3D.

A concrete manufacturing procedure of the heat sink 1A includes the following steps.
(1) manufacture of base sheets of the layers (FIG. 3A)
(2) etching of sheet materials (formation of a water channel structure) (FIG. 3B)
(3) bonding of the sheet materials (FIG. 3C)

(4) heating and pressure-bonding of the sheet materials (FIG. 3D)

The base sheet is formed in a thin plate shape using, for example, copper, silver, or gold having high thermal conductivity. The base sheets of the layers 21 to 25 are made of a single (the same) metal material. The layers 21 to 25 are bonded by directly stacking the base sheets subjected to etching of the water channel structure without using the insert metal. For the bonding, a technique such as solid-phase diffusion bonding may be used. In such a manner, the heat sink 1A is formed by using the single material. Since the heat sink 1A is made of the single material, the surfaces of the base sheets constructing the layers 21 to 25 including the end 41 of the bonded part 4 are exposed in the inner surface of the water channel 3. Since dissimilar metals do not exist in the water channel 3 in the structure, no influence of the galvanic corrosion is exerted on reliability.

As described above, in the heat sink 1A and the laser diode of the embodiment, all of the thin films (base sheets) of the layers 21 to 25 in the heat sink 1A are made of the single metal material. The thin films made of the single meal material are directly stacked and bonded without using an insert metal. Thus, the surface in the water channel 3 including the end 41 of the bonded part 4 is made of the same metal material. As a result, dissimilar metals do not exist in the water channel, deterioration in the structure of the inner wall of the water channel due to galvanic corrosion is prevented, and the reliability is improved.

Second Embodiment

A second embodiment of the invention will be described. The same reference numerals are designated to the parts substantially the same as those of the first embodiment and their description will not be repeated.

Figure 4:
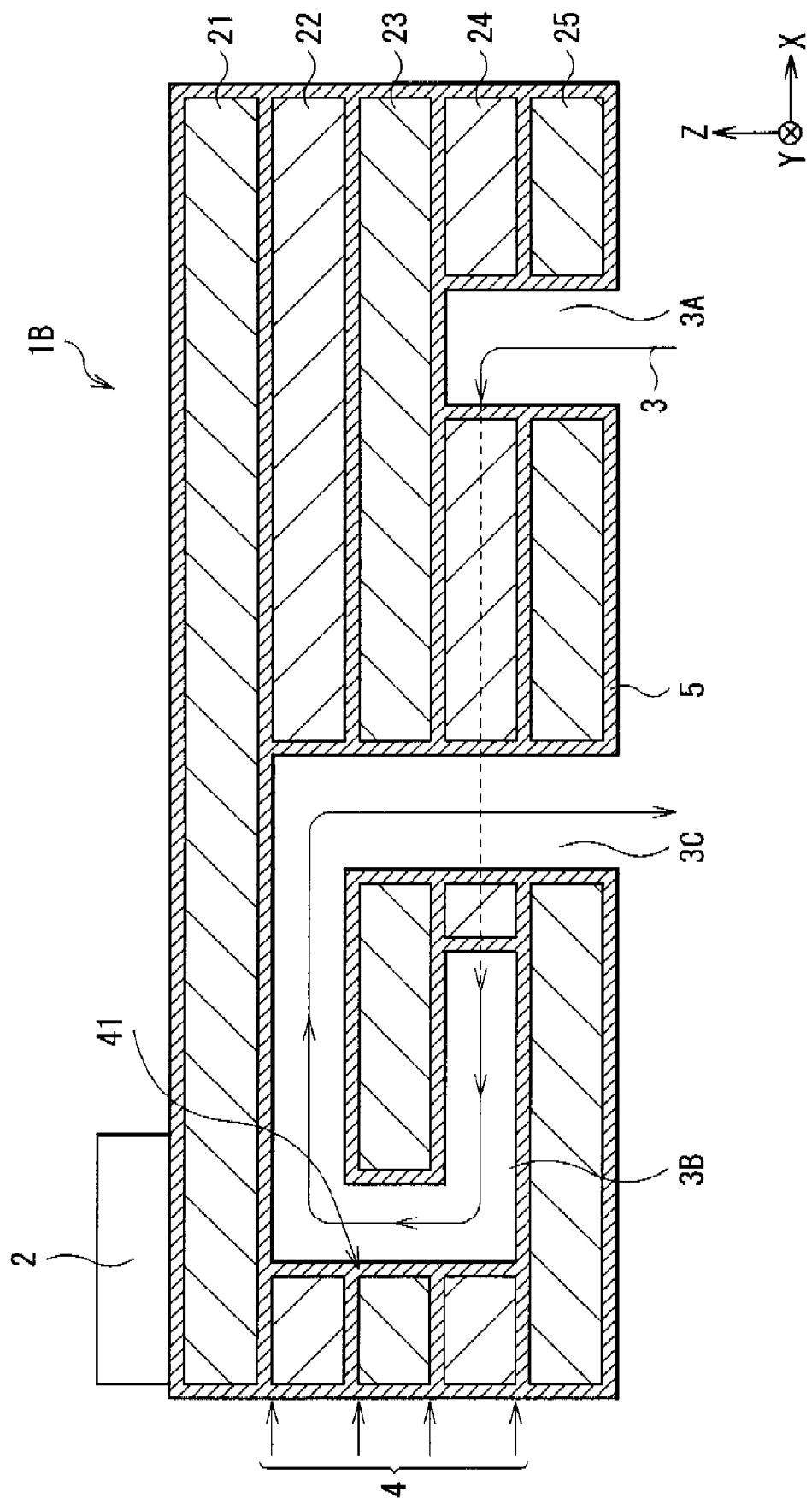
FIG. 4 is a cross section showing an example of a laser diode as a second embodiment of the invention.

FIG. 4 shows a configuration example of a laser diode as a second embodiment of the invention.

The laser diode as the second embodiment is obtained by having a heat sink 1B in place of the heat sink 1A (FIG. 1) in the first embodiment. The heat sink 1B has a basic configuration similar to that of the heat sink 1A in the first embodiment except for a layer bonding structure.

In the second embodiment, the entire surfaces of the layers 21 to 25 in the heat sink 1B are covered with a bonding metal (insert metal) 5 as a single metal material (for example, silver, gold, or nickel). As a result, in the surface (inner wall) in the water channel 3 including the end 41 (the end on the water channel 3 side between the layers), the bonding metal 5 is exposed.

A method of manufacturing the heat sink 1B will now be described with reference to FIGS. 6A to 6C.

Figure 5C:
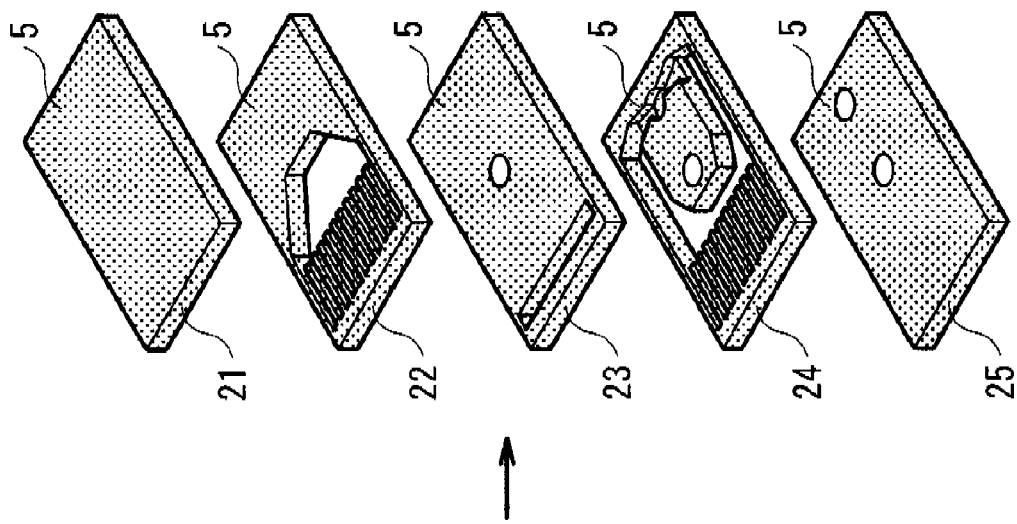
FIGS. 5A to 5C are manufacture process drawings showing an example of a method of manufacturing a heat sink in the second embodiment of the invention.
Figure 5B:
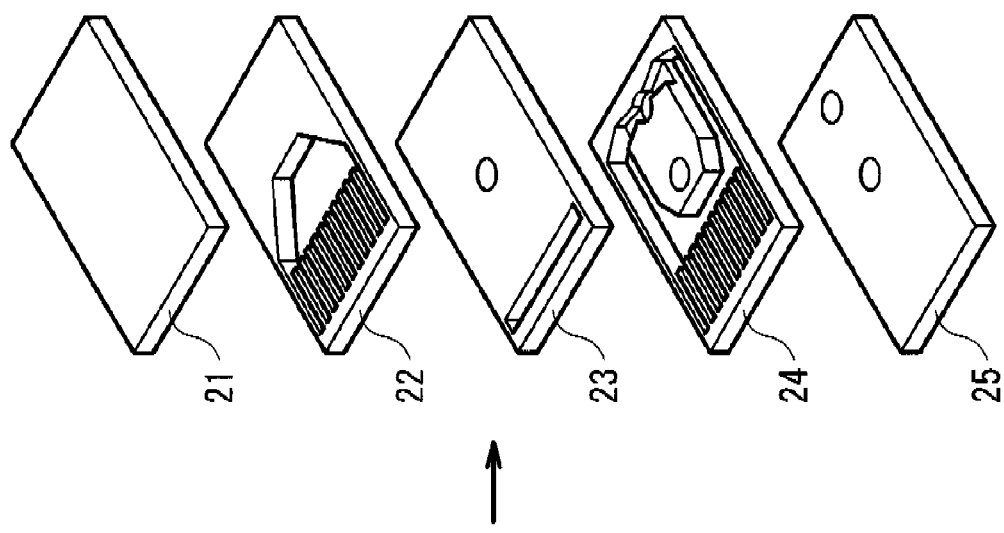
Figure 5A:
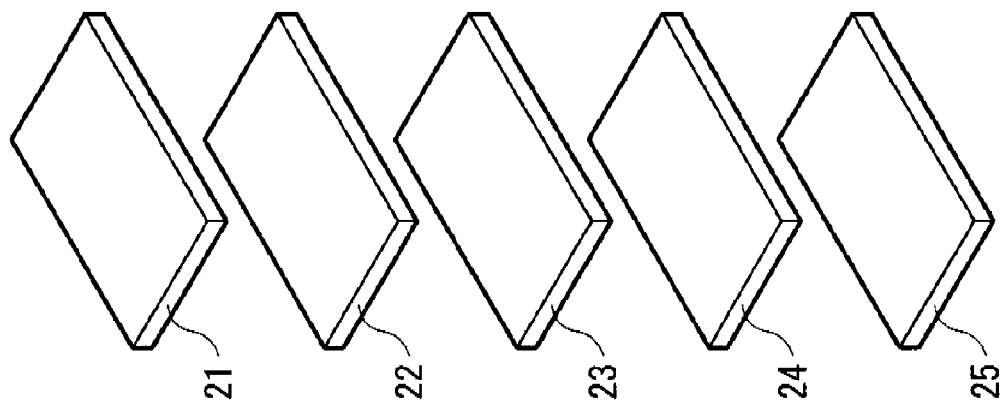

A concrete manufacturing procedure of the heat sink 1B includes the following steps.
(1) manufacture of base sheets of the layers (FIG. 5A)
(2) etching of sheet materials (formation of a water channel structure) (FIG. 5B)
(3) formation of the bonding metal 5 to the sheet materials (FIG. 5C)
(4) bonding of the layers
(5) heating and pressure-bonding of the layers The processes except for forming the bonding metal 5 to the sheet material are basically similar to those of the first embodiment. Different from the first embodiment, it is not necessary to use a single (the same) metal material for the base sheet. The bonding metal 5 may be formed by, for example, plating or vapor deposition. In the embodiment, the layers 21 to 25 are stacked and bonded with the bonding metal 5. The bonding method is preferably solid-phase diffusion bonding. The solid-phase diffusion bonding is bonding of solid-phase surfaces in a solid-phase state at a temperature equal to or lower than the melting point of the bonding material. As a result, a structure hardly having material unevenness in the water channel 3 is obtained at the time of bonding.

In such a manner, the heat sink 1B whose surface is made of a single material is formed. Since the entire surface is made of a single material, the bonding metal 5 including the end 41 of the bonded part 4 is exposed in the inner surface of the water channel 3. Since dissimilar metals do not exist in the water channel 3 in the structure, no influence of the galvanic corrosion is exerted on reliability.

As described above, in the heat sink 1B and the laser diode of the second embodiment, the bonding metal 5 as the single metal material is exposed in all of the surfaces of the layers 21 to 25 in the heat sink 1B. Thus, the inner surface of the water channel 3 including the end 41 of the bonded part 4 is made of the same metal material. As a result, dissimilar metals do not exist in the water channel, deterioration in the structure of the inner wall of the water channel due to galvanic corrosion is prevented, and the reliability is improved.

Third Embodiment

A third embodiment of the invention will be described. The same reference numerals are designated to the parts substantially the same as those of the first or second embodiment and their description will not be repeated.

Figure 6:
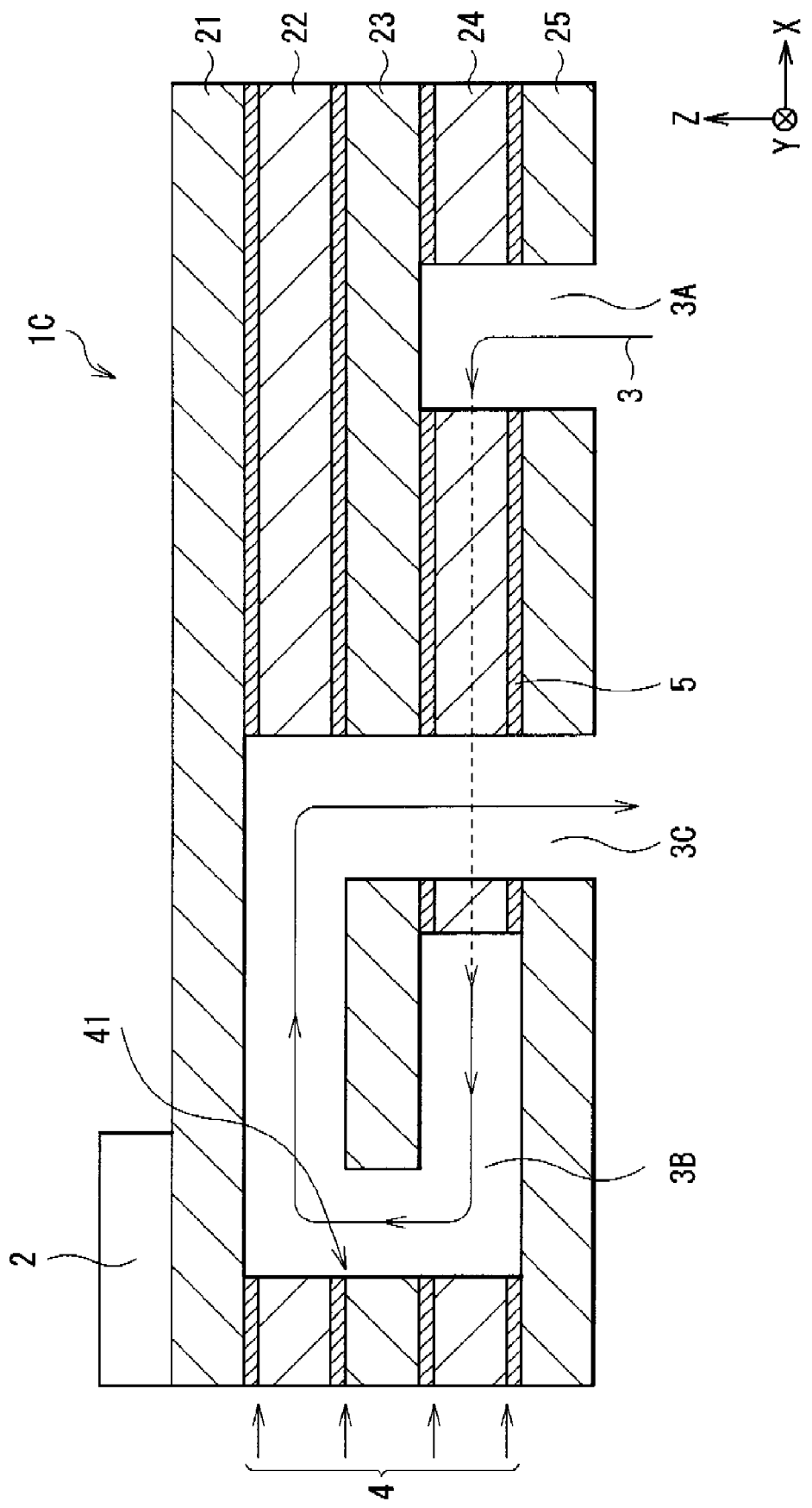
FIG. 6 is a cross section showing an example of a laser diode as a third embodiment of the invention.
Figure 7A:
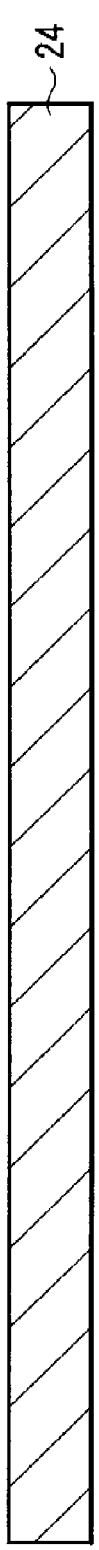
FIGS. 7A to 7D are manufacture process drawings showing an example of a method of manufacturing a heat sink in the third embodiment of the invention.
Figure 7B:
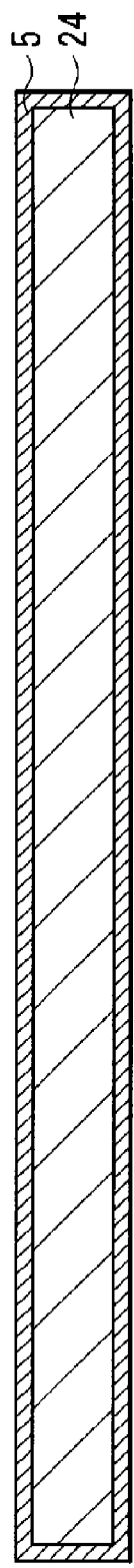
Figure 7C:
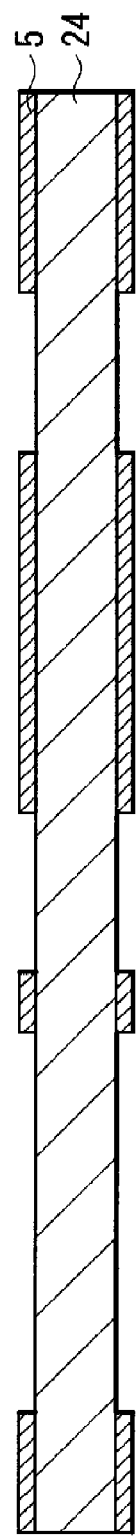
Figure 7D:
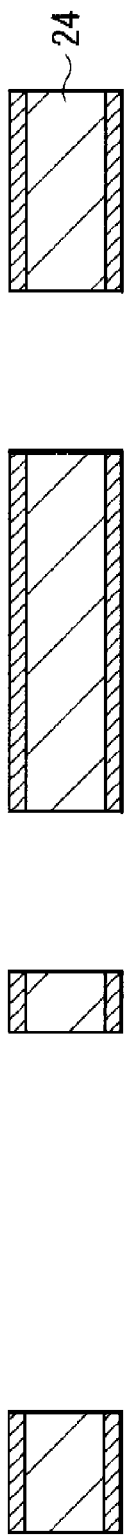

FIG. 6 shows a configuration example of a laser diode as a third embodiment of the invention.

The laser diode as the third embodiment has a heat sink 1C in place of the heat sink 1A (FIG. 1) in the first embodiment. The heat sink 1C in the third embodiment has a basic configuration similar to that of the heat sink 1A in the first embodiment except for a layer bonding structure.

In the heat sink 1B (FIG. 4) in the second embodiment, the entire surfaces of the layers 21 to 25 in the heat sink 1B are covered with the bonding metal 5. In the heat sink 1C of the third embodiment, the bonding metal 5 is formed only in minimum parts. As a result, in the surface (inner wall) in the water channel 3, the surfaces of the thin plates (base materials) of the layers 21 to 25 are exposed except for the end 41 of the bonded part 4 (the end on the water channel 3 side between the layers).

A method of manufacturing the heat sink 1C will now be described with reference to FIGS. 7A to 7D. In FIGS. 7A to 7D, only the process of manufacturing the fourth layer 24 is shown representatively.

A concrete manufacturing procedure of the heat sink 1C includes the following steps.
(1) manufacture of base sheets of the layers (FIG. 7A)
(2) formation of the bonding metal 5 on the sheet material (FIG. 7B)
(3) etching of the bonding metal 5 (FIG. 7C)
(4) etching of sheet materials (formation of a water channel structure) (FIG. 7D)
(5) bonding of the layers
(6) heating and pressure-bonding of the layers In the second embodiment, the bonding metal 5 is formed after etching of the sheet materials (formation of the water channel structure). In the third embodiment, before formation of the water channel structure, the bonding metal 5 is formed. For the base sheets, in a manner similar to the first embodiment, a single (the same) metal material (for example, copper) is used for the layers 21 to 25. The bonding metal 5 is, for example, silver, gold, or nickel and may be formed by, for example, plating or vapor deposition. In the third embodiment, after the bonding metal 5 is formed, the etching process is performed twice. Also in the third embodiment, like the second embodiment, the method of bonding the layers 21 to 25 is preferably solid-phase diffusion bonding. The solid-phase diffusion bonding is carried out by making atoms mutually diffused between the base material and the bonding metal 5, so that a shape change in the bonding metal 5 is extremely small. Consequently, by using the solid-phase diffusion bonding, it is possible to minimize a shape change and melting of the bonding metal 5 at the time of bonding.

With such processes, in the water channel 3, the surfaces of the thin plates (base material) of the layers 21 to 25 are exposed except for the small part in the end 41 of the bonded part 4. As a result, although bonding using the bonding metal 5 is performed, the exposure of the bonding metal 5 is minimized and a structure in which dissimilar metals hardly exist in the water channel 3 is obtained. Thus, no influence of the galvanic corrosion is exerted on reliability. In the third embodiment, both easiness of manufacture using the bonding metal 5 and improvement in reliability against galvanic corrosion are satisfied.

Concrete Example

In the embodiments, the ratio of a noble metal in the water channel 3 may be reduced as compared with that in the technique of the related art. In the structure of the related art (FIG. 8), in the inner wall of the water channel, the noble insert metal is exposed from the heat sink material, and galvanic corrosion is promoted. On the other hand, in the heat sink 1C of the third embodiment, the water channel 3 made of almost 100% of copper may be formed, and galvanic corrosion rate may be minimized.

Figure 8:
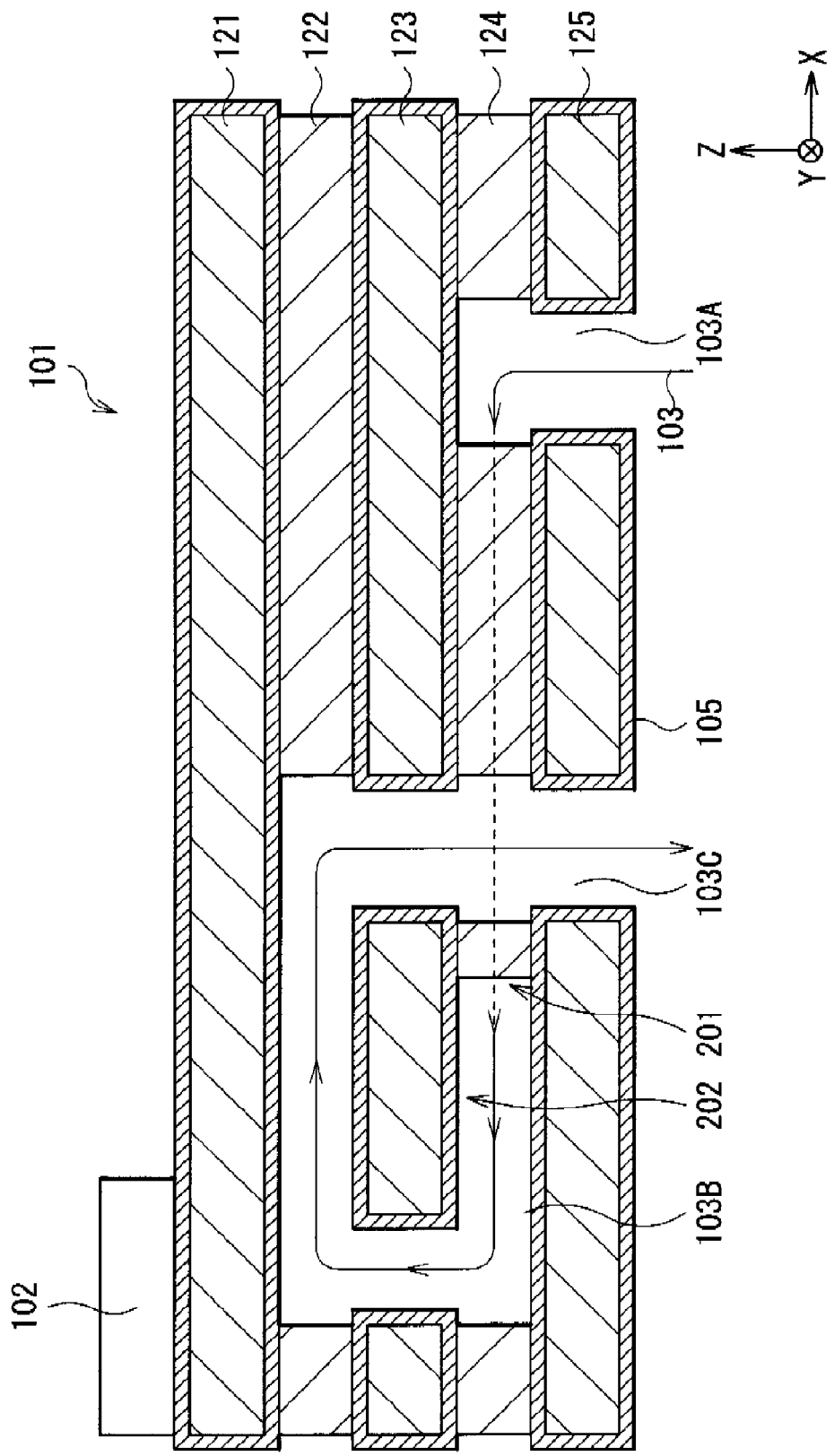
FIG. 8 is a cross section showing an example of a laser diode of the related art.
Figure 9:
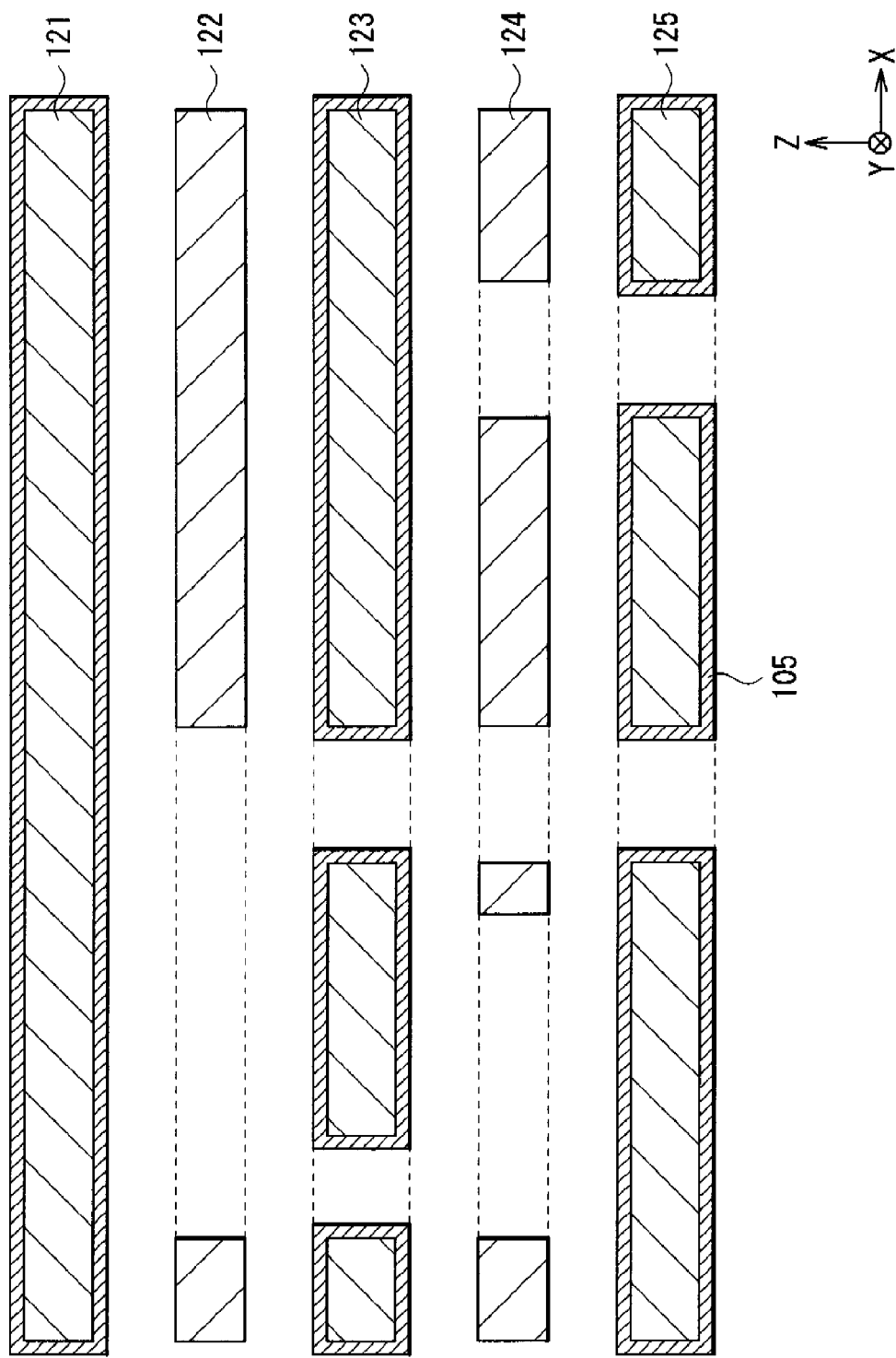
FIG. 9 is a manufacture process drawing showing an example of a method of manufacturing a heat sink of the related art.

Concretely, with respect to the rate of corrosion, the following relation is satisfied generally.

$$P = P0(1 + B/A)$$

where
P: corrosion rate of base metal after the base metal comes into contact with the noble metal
P0: corrosion rate of the single base metal
A: surface area of the base metal
B: surface area of the noble metal In this case, the noble metal is, for example, copper on the base material side, and the base material is, for example, gold of the bonding metal 5. By setting the surface areas A and B as the area in the water channel 3, the corrosion rate in the water channel 3 is able to be calculated. Hitherto, in the configuration as shown in FIG. 8 using liquid-phase diffusion bonding, when it is assumed that the surface area A is about 800 mm$^2$ and the surface area B is about 10 mm$^2$, the corrosion rate (P) is about $0.06 \times 10^{-3}$ mm. In contrast, in the structure of the embodiment (FIG. 6), leakage life is increased by 16,825 times.

The invention is not limited to the foregoing embodiments but can be variously modified.

For example, the water channel structure shown in the foregoing embodiments is not limited to the structures shown in the diagrams but may be other structures. The number of layers in the layer structure of the heat sink is not limited to five but may be four or less or six or more.

Obviously many modifications and variations of the present invention are possible in the light of the above teachings. It is therefore to be understood that within the scope of the appended claims the invention may be practiced otherwise than as specifically described.

What is claimed is:

1. A heat sink for use with an electronic device, the heat sink comprising:
    a structure formed of thin plates that are successively stacked one upon another and directly bonded to each other, some of the successively stacked thin plates being etched so that a water channel is formed within the structure,
wherein,
    each of the successively stacked thin plates is made of a single metal material,
    water in the water channel is substantially exposed only to the single metal material, and
    the successively stacked thin plates include, in this order, at least
        (i) a mounting thin plate onto which the electronic device is mounted,
        (ii) a first radiator-fin thin plate having a first plurality of radiator fins and a first intermediate water channel formation part,
        (iii) an intermediate thin plate having only (a) a second intermediate water channel formation part and (b) a first exhaust water channel formation hole, a position of the second intermediate water channel formation part in the intermediate thin plate corresponding to a position of the first plurality of radiator fins in the first radiator-fin thin plate,
        (iv) a second radiator-fin thin plate having (a) a second plurality of radiator fins, (b) a third intermediate water channel formation part, (c) a first supply water channel formation hole, and (d) a second exhaust water channel formation hole, the third intermediate water channel formation part being formed about an island portion in the second radiator-fin thin plate, the second exhaust water channel formation hole being formed in the island portion, and the first supply water channel formation hole being formed partially in the island portion so that water entering through the first supply water channel formation hole is then directed into the third water channel formation part formed about the island portion,
        (v) a bottom plate having (a) a second supply water channel formation hole and (b) a third exhaust water channel formation hole,
    wherein:
        (1) the second supply water channel formation hole in the bottom plate and the first supply water channel formation hole in the second radiator-fin thin plate form a water supply channel,
        (2) the third intermediate water channel formation part in the second radiator-fin thin plate, the second plurality of radiator fins in the second radiator-fin thin plate, the second intermediate water channel formation part in the intermediate thin plate, the first intermediate water channel formation part in the first radiator-fin thin plate, and the first plurality of radiator fins in the first radiator-fin thin plate form an intermediate water channel through which water flows after passing through the water supply channel, and
        (3) the first exhaust water channel formation hole in the intermediate thin plate, the second exhaust water channel formation hole in the second radiator-fin thin plate, and the third exhaust water channel formation hole in the bottom thin plate form an exhaust water channel through which water flows after passing through the intermediate water channel.

2. A laser diode comprising:
a heat sink; and
a semiconductor laser device mounted on the heat sink,
wherein,
   the heat sink has a structure formed of thin plates that are successively stacked one upon another and directly bonded to each other, some of the successively stacked thin plates being etched so that a water channel is formed within the structure,
   each of the successively stacked thin plates is made of a single metal material,
   water in the water channel is substantially exposed only to the single metal material, and
   the successively stacked thin plates include, in this order, at least
   (i) a mounting thin plate onto which the semiconductor laser device is mounted,
   (ii) a first radiator-fin thin plate having a first plurality of radiator fins and a first intermediate water channel formation part,
   (iii) an intermediate thin plate having only (a) a second intermediate water channel formation part and (b) a first exhaust water channel formation hole, a position of the second intermediate water channel formation part in the intermediate thin plate corresponding to a position of the first plurality of radiator fins in the first radiator-fin thin plate,
   (iv) a second radiator-fin thin plate having (a) a second plurality of radiator fins, (b) a third intermediate water channel formation part, (c) a first supply water channel formation hole, and (d) a second exhaust water channel formation hole, the third intermediate water channel formation part being formed about an island portion in the second radiator-fin thin plate, the second exhaust water channel formation hole being formed in the island portion, and the first supply water channel formation hole being formed partially in the island portion so that water entering through the first supply water channel formation hole is then directed into the third water channel formation part formed about the island portion,
   (v) a bottom plate having (a) a second supply water channel formation hole and (b) a third exhaust water channel formation hole,
   wherein:
      (1) the second supply water channel formation hole in the bottom plate and the first supply water channel formation hole in the second radiator-fin thin plate form a water supply channel,
      (2) the third intermediate water channel formation part in the second radiator-fin thin plate, the second plurality of radiator fins in the second radiator-fin thin plate, the second intermediate water channel formation part in the intermediate thin plate, the first intermediate water channel formation part in the first radiator-fin thin plate, and the first plurality of radiator fins in the first radiator-fin thin plate form an intermediate water channel through which water flows after passing through the water supply channel, and
      (3) the first exhaust water channel formation hole in the intermediate thin plate, the second exhaust water channel formation hole in the second radiator-fin thin plate, and the third exhaust water channel formation hole in the bottom thin plate form an exhaust water channel through which water flows after passing through the intermediate water channel.

* * * * *